United States Patent [19]
Antonello et al.

[11] Patent Number: 5,767,692
[45] Date of Patent: Jun. 16, 1998

[54] DEVICE FOR CONVERTING THE TEST POINT GRID OF A MACHINE FOR ELECTRICALLY TESTING UNASSEMBLED PRINTED CIRCUIT BOARDS

[75] Inventors: Gianpaolo Antonello; Alberto Giani, both of Verona, Italy

[73] Assignee: Circuit Line Spa, Verona, Italy

[21] Appl. No.: 622,894

[22] Filed: Mar. 29, 1996

[51] Int. Cl.⁶ .................................................. G01R 31/02
[52] U.S. Cl. ........................................ 324/761; 324/754
[58] Field of Search .................................. 324/754, 755, 324/761, 758

[56] References Cited

U.S. PATENT DOCUMENTS

| | | | |
|---|---|---|---|
| 4,535,536 | 8/1985 | Wyss | 324/754 |
| 4,774,459 | 9/1988 | Maelzer et al. | 324/754 |
| 4,977,370 | 12/1990 | Andrews | 324/761 |
| 5,157,325 | 10/1992 | Murphy | 324/761 |
| 5,493,230 | 2/1996 | Swart et al. | 324/754 |

*Primary Examiner*—Ernest F. Karlsen
*Assistant Examiner*—Anh Phung
*Attorney, Agent, or Firm*—Sixbey, Friedman, Leedom & Ferguson; David S. Safran

[57] ABSTRACT

An interface device for converting the test point grids of machines for electrically testing unassembled printed circuit boards to a lower density grid, to be interposed between the test machine grid (1) and the corresponding fixture (3). The interface device comprises a plurality of flat parallel plates (10, 11, 12, 13, 14) suitably perforated so that needles can pass through them, the plate (14) facing the grid (1) having the same perforation as the grid (1) and having some of its holes (21) unoccupied by said needles (15), whilst the outer plates (10, 11) have all the holes occupied by said needles (15), reproducing the desired lower density grid configuration.

18 Claims, 2 Drawing Sheets

DEVICE FOR CONVERTING THE TEST POINT GRID OF A MACHINE FOR ELECTRICALLY TESTING UNASSEMBLED PRINTED CIRCUIT BOARDS

DESCRIPTION

The present invention relates to a device for converting the test point grid of a machine for electrically testing unassembled printed circuit boards.

A printed circuit board (PCB) is a base of insulating material on which electrical connections are marked, normally by means of a chemical subtractive process, to link the various components that are to be installed, generally by soldering, on said circuit.

These printed circuit boards are tested before installation of the components, that is to say they are checked and analysed to ensure that all the nets present on the board are insulated from each other and that there is electrical continuity between all points in each net.

The electrical test phase for a PCB therefore comes at the end of the production cycle of the circuit. The machines used to carry out this type of test normally operate with a universal contact grid, that is with a constant pitch, also known as a "needle bed".

Since the printed circuit board to be tested has connection points between the different components arranged in a variable manner—and therefore not referable to a constant pitch grid—, in order to perform the test an adapter or fixture is inserted that allows the points on the circuit to be matched to the grid contacts.

The reduction in the distance between the terminals of the electronic components arranged on the periphery of the relative container and the introduction of new types of components with terminals arranged in a matrix beneath the entire area of the container (BGA: ball grid array), have considerably increased the density of the test points per square inch on a printed circuit board.

The standard configuration of the test grids on universal machines has a grid with a constant pitch of 100 mil, with an available point density of 100 points per square inch. This is no longer sufficient to test printed circuit boards with a high component density, therefore it becomes necessary to create higher density grids, whose typical densities can be, for example, 144 points per square inch, 200 points per square inch and 400 points per square inch, depending upon the complexity of the circuits produced.

Obviously, the increase in density leads to a corresponding increase in the overall number of points needed to make grids having the same area covered by the configuration with a standard density of 100 points per square inch, with a consequent increase in the cost of the machine.

The best compromise must therefore be sought between the area necessary to test the products made and a sufficient density to ensure the feasibility of the test. For this reason it is advantageous to choose the most suitable grid pitch to solve the most complex test problem. This choice can, however, lead to grid pitch values or configurations that make it incompatible with the classical 100 mil pitch grid or with other grid configurations present in the company.

This therefore means that different machines must be used to test circuits of different complexity, that is with a different component density, resulting in heavy investments.

In theory, a high density grid, for example with a 50 mil pitch (400 points per square inch) could accept devices, that is fixtures, made for 100 mil grids (100 points per square inch), since the latter is a subset of the former.

However, there is a physical limit to this compatibility, due to the typical diameter of the holes in the 100 mil grid (about 2 mm) compared with those in the 50 mil grid (about 1 mm). Since the devices (adapters or fixtures) for 100 mil grids make use of test needles with a diameter greater than 1 mm, in practice they cannot be used on the 50 mil grid, even if the test point is available.

The aim of the invention is to eliminate the drawbacks illustrated above, solving the problem of the incompatibility of test fixtures with grids of different densities.

In particular, the aim of the invention is to allow the use of the same test machine with test grids of different densities, thus allowing printed circuit boards of varying complexity to be tested.

The device according to the invention substantially ensures compatibility between a higher density grid and any other lower density configuration.

The device according to the invention consists of an interface between the test grid and the fixtures, which reproduces the grid configuration at the lower desired density, with the same characteristics.

This interface is interchangeable, so that it can be removed or replaced to allow the test machine to be used at the desired density and to re-utilize all the fixtures already produced for machines with another grid configuration.

Another advantage of the interface device according to the invention lies in the fact that it allows the exact physical characteristics of the lower density grid to be reproduced (hole diameters, machine contact size), ensuring complete compatibility with the fixtures already created.

The interface device according to the invention comprises a structure consisting of a plurality of flat, parallel plates, suitably perforated to ensure the passage of conductor needles capable of transferring the electrical contact between the higher density grids and the new lower density grid. An outer plate of this structure comes into contact with the higher density grid present on the test machine and reproduces the perforation of the same grid of the machine. The other outer plate of said structure supports the fixture which comes into contact with the printed circuit board and reproduces the perforation of the new lower density grid that is to be created.

The interface device according to the invention constitutes a structure similar to a test fixture, and can therefore be easily removed from the machine.

A suitable test machine management program allows the test to be performed with different grids, the rule for conversion between the two assemblies being constant.

Further characteristics of the invention will be made clearer by the detailed description that follows, referring to a single purely exemplary and therefore non-limiting embodiment, illustrated in the attached drawings in which.

Figure 1:
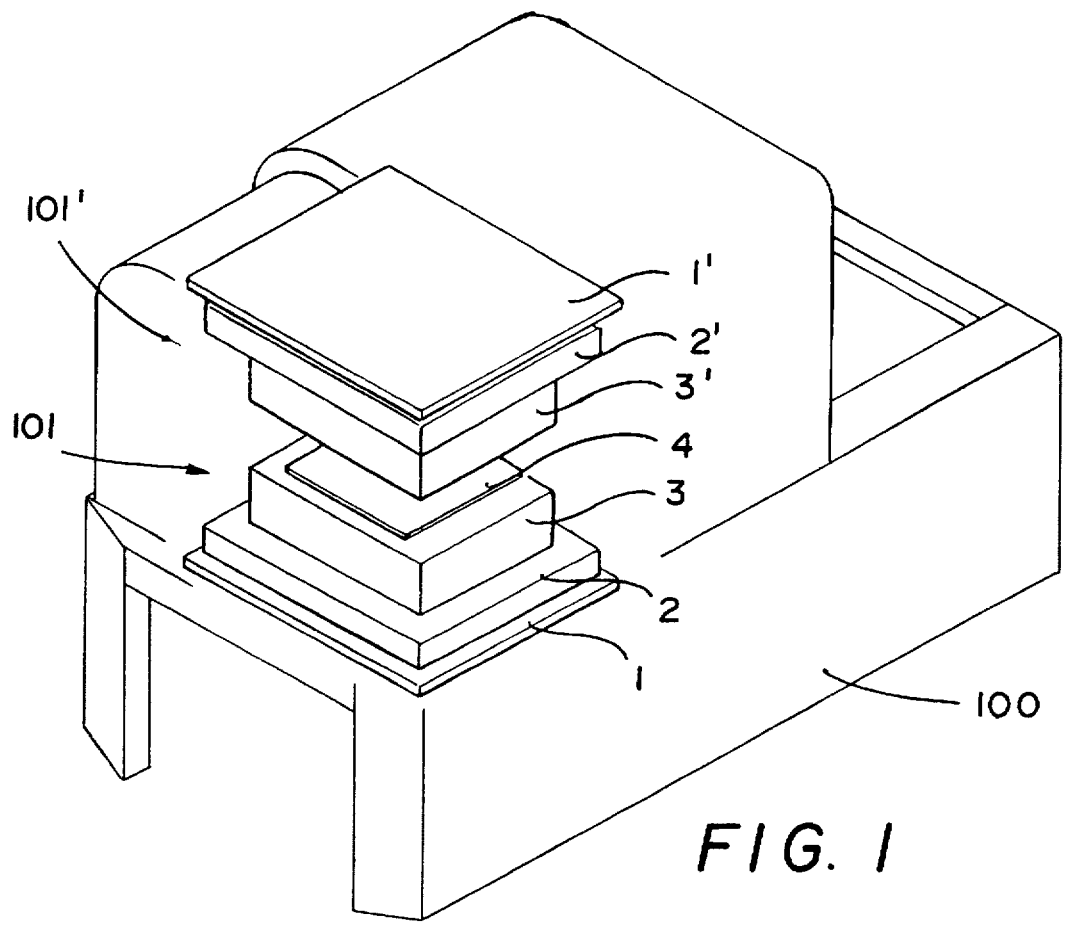
FIG. 1 is a diagrammatic axonometric view of a machine for electrically testing printed circuit boards, showing in particular the test area, where test assemblies for the simultaneous test on both sides of a printed circuit board are arranged.

In FIG. 1, 100 indicates a test machine for printed circuit boards, comprising, in the test area, a lower assembly 101 and an upper assembly 101', for carrying out simultaneous tests on both sides of a printed circuit board 4.

The two test assemblies 101 and 101' comprise respective constant pitch grids 1, 1', on which the interface devices 2, 2' according to the invention are positioned, in order to obtain the new grid configuration with a maximum test area size always equal to that of the higher density grid 1, 1'. The outer face of the interface device 2, 2' bears exactly the same grid structure that is to be simulated, and the respective lower fixture 3 and upper fixture 3' are positioned to correspond to it. The printed circuit board 4 is positioned on the lower fixture 3 in the usual manner.

The result of the printed circuit test will be provided with reference to the new grid structure determined by the interface devices 2, 2', thanks to a suitable program comprising the rule for creation of the interface device.

With reference to the section in FIG. 2, the lower test assembly 101 will now be described in greater detail.

As can be seen in this figure, the interface device 2 is positioned on elastic elements 17, integral with the high density grid 1, whose main purpose is reciprocal centring between the grid 1 and the device 2.

The interface device 2 comprises a plurality of flat parallel plates, indicated by reference numbers 10, 11, 12, 13, 14, respectively, proceeding from top to bottom. Translation needles 15 pass through said plates, which are suitably perforated, and make the electrical connection between spring contacts 16 of the high density grid 1 and corresponding needles 18 of the adapter or fixture 3.

The lower plate 14 of the interface device 2 has the same perforation as the grid 1, but not all its holes 21 are occupied by the translation needles 15. The distance between the plates 13 and 14 is such as to allow the unused spring contacts 16 of the grid 1 never to be pressed during the test stroke. In other words, the distance between the free ends of the contacts 16 and the plate 13 is greater than the downstroke of the structure during the test. The interface device 2 must therefore be made in such a way as to require that only the contacts 16 which correspond to a needle 18 of the fixture 3 be pressed, as usually happens in an arrangement where constant pitch grids are in direct contact with the fixture 3.

This characteristic proves to be an advantage as regards both the duration of the spring contacts 16 and the stress required of the mechanical structure of the machine.

In fact, on the one hand, when the fixture 3 is changed, following a change in the printed circuit board to be tested, other contacts 16 of the grid 1 will be involved; on the other hand the pressing force is given by the number of points on test, corresponding to the number of needles 18 in the fixture 3, multiplied by the thrust of the single needle 16, whilst in the case of the whole grid 1 being involved, the effects of all the needles in the grid 1 would combine.

The two intermediate plates 12, 13 of the interface device 2 guide the needles 15 towards the upper end plates 11, 10, simulating the lower density grid. In particular, the innermost of these two plates 11 has a greater thickness, to withstand the bending of the entire device 2 during the working pressing, and allow the needles 15 to slide correctly.

The upper plate 10 has a variable thickness, to the point of being able to be completely eliminated, so that the same compression of the spring contacts 16 of the grid 1 is always obtained, according to how much the needles 18 protrude from the fixture 3. The plate 10 can be easily replaced, even leaving the interface device 2 installed on the test machine, to aid correct interfacing to the fixture 3 used and therefore allow use of the majority of fixtures present on the market.

The fixture 3 comprises, in a per se known manner, a plurality of flat, parallel plates 31, 32, 33, 34, suitably perforated for passage of the needles 18, which serve to test the circuit 4. Said fixture 3 will not be further described in that it is to be considered widely known in the field.

Figure 3:
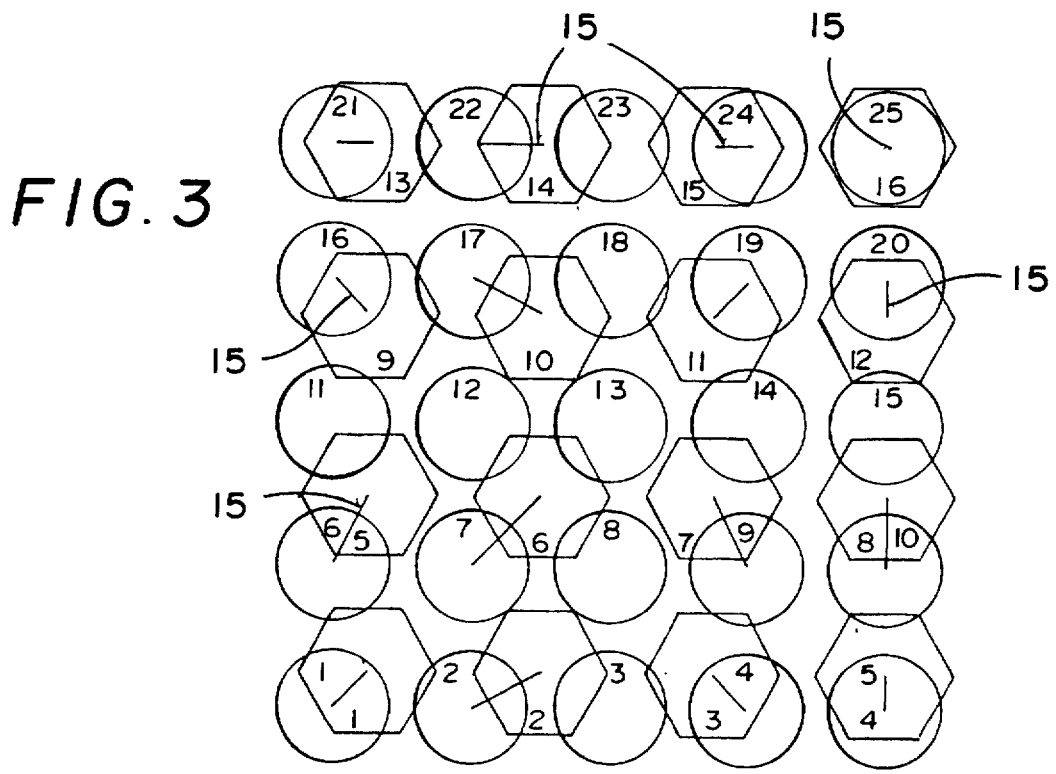
FIG. 3 is a scheme showing the rule for allocating the higher density grid points, for example with an 80 mil pitch, to a lower density grid, for example with a 100 mil pitch.

In FIG. 3 a repetitive module has been schematised representing the allocation rule for allocating an 80 mil grid (holes shown as circles and numbered in the upper part) with a 100 mil grid (holes shown as hexagons and numbered in the lower part).

The drawing shows, in a highly enlarged view, an actual basic module consisting of 25 points in an 80 mil grid translated into 16 points in a 100 mil grid. The figure also schematically indicates the needles 15 connecting all the hexagonal holes in the 100 mil grid with corresponding circular holes (obviously not all of them) in the 80 mil grid (with higher density).

A complete embodiment of an interface device 2 can include an arbitrary number of modules illustrated in FIG. 3, suitably combined to form the entire test grid. An exemplary embodiment comprises 1920 modules, corresponding to 48000 points in an 80 mil grid and 30720 points in a 100 mil grid, giving an overall test area of 19.2"×16"(48 cm×40 cm).

The interface device 2 according to the invention can be applied to any pitch of grid 1, even an irregular one, provided it is of higher density than the corresponding grid obtained, which can also be irregular.

Figure 2:
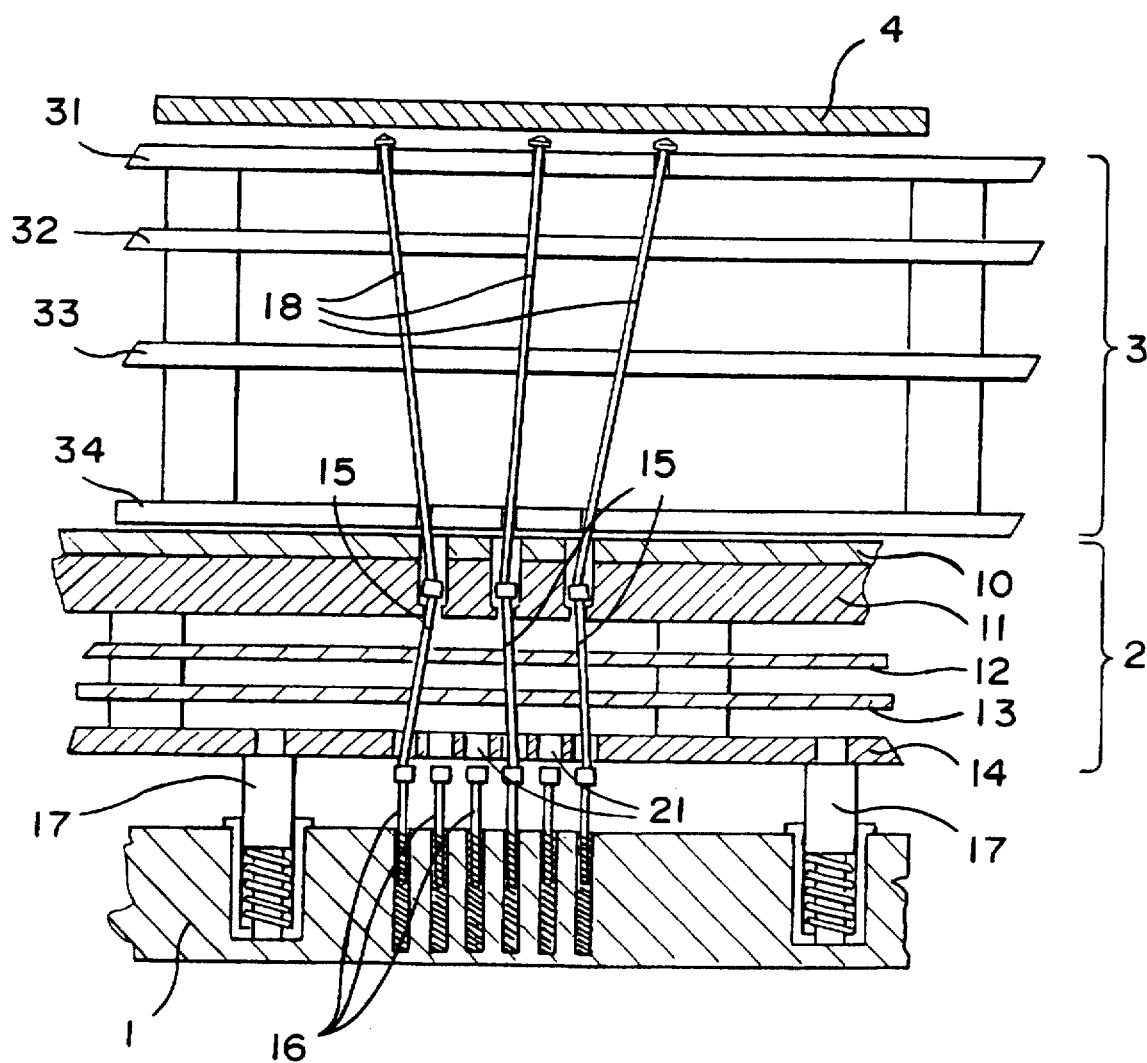
FIG. 2 is a cross section of the lower test assembly, comprising the interface device according to the invention.

In FIG. 2 spring contacts 16 for the grid 1 and rigid needles 15 for the interface device 2 are illustrated. It is nevertheless obvious that one can have spring needles in the device 2 and rigid contacts in the grid 1, or any combination of rigid and spring contacts both in the interface device 2 and in the grid 1.

What has been stated for the lower test assembly 101 shown in FIG. 2 also applies in exactly the same way to the upper test assembly 101'.

We claim:

1. A device for converting a test point grid of a test machine for electrically testing unassembled printed circuit boards, comprising an interchangeable interface device to be interposed between a machine grid of the test machine having a plurality of needles of a first density and an adaptor fixture having a number of needles matched to test points of a printed circuit board/s to be tested, the density of the number of needles of said adaptor fixture being a lower density than said first density of the needles of the machine grid; wherein said interface device has a grid opening configuration on a side facing said adaptor fixture which is of a lesser density than the needle density of the machine grid, and has a grid opening configuration on a side facing the machine grid which has a density of openings which is matched to the density of the needles of the machine grid; and wherein interface conductor needles are provided extending through the interface device for making an electrical connection between the needles of the machine grid and the corresponding needles of the fixture, said interface conductor needles being of a number matched to the number of openings of the grid on the side of the interface device facing the adaptor fixture but being less than the number of openings of the grid on the side of the interface device facing the machine grid.

2. A device according to claim 1, characterised in that the lower density grid opening configuration of said interface device and/or the density of the grid opening configuration of the interface device facing the machine grid may or may not have a constant pitch.

3. A device according to claim 1, characterised in that said interface device comprises a plurality of parallel plates, through which said interface conductor needles pass for making said electrical connection between the needles of the machine grid and the corresponding needles of the adaptor fixture.

4. A device according to claim 3, characterised in that the plate of the interface device facing the machine grid has the same perforation as the grid, not all its holes being occupied by the needles, whilst the plates placed one above the other facing towards the fixture, have a perforation corresponding to the lower density grid that is to be obtained, all the holes in said plates facing towards the fixture being occupied by corresponding needles.

5. A device according to claim 1, characterised in that said interface device (2, 2') is positioned on elastic elements (17) integral with said high density grid (1, 1').

6. A device according to claim 1, characterised in that the unused contact needles (16) of the grid (1, 1') are not pressed during the test stroke.

7. A device according to claim 3, characterised in that said outer plate of the interface device facing toward the fixture is one of a plurality of interchangeable outer plates, each of which is of a different thickness, said interface device also being operable without said outer plate, so that the same compression of the contacts of the grid is always obtained, depending on how much the needles of the fixture protrude.

8. A device according to claim 1, characterised in that said grid (1, 1') and/or said interface device (2, 2') comprise any combination of rigid and spring needles (16, 15).

9. A device according to claim 1, characterised in that a said interface device is provided for both a lower adaptor fixture and an upper adaptor fixture of a machine for the simultaneous testing of both sides of at least one printed circuit board.

10. A machine for the electrical test on printed circuit boards, comprising a machine grid of needle contacts and an adaptor fixture with a plurality of needles of a density less than the density of the needle contacts of the machine grid and matched to test points of at least one printed circuit board to be tested and corresponding needle contacts of an interface device disposed between said grid and said fixture, wherein said interface device has a grid opening configuration with a density of openings of a lower density than the density of the needles of the machine grid on the side of the interface device facing towards said fixture and has a grid opening configuration on the side of the interface device facing toward the machine grid which has an opening density that is matched to the density of the needle contacts of the machine grid, and wherein a number of said interface conductor needles is provided which is matched to the number of openings of grid opening configuration on the side of the interface device facing the adaptor fixture but is less than the number of openings of the grid opening configuration on the side of the interface device facing the machine grid.

11. A machine according to claim 10, characterised in that said higher density grid opening configuration of and/or said lower density grid opening configuration of the interface device may or may not have a constant pitch.

12. A machine according to claim 10, characterised in that said interface device comprises a plurality of parallel plates with holes through which the interface conductor needles pass, making an electrical connection between the needles of the machine grid and corresponding needles of the adaptor fixture.

13. A machine according to claim 12, characterised in that the plate of the interface device facing towards the machine grid (1, 1') has the same perforation as the machine grid, not all its holes being occupied by the needles (15), whilst two plates (10, 11) placed one on top of the other facing towards the fixture (3, 3'), have a perforation corresponding to the lower density grid that is to be obtained, all the holes in said plates (10, 11) being occupied by corresponding needles (15).

14. A machine according to claim 10, characterised in that said interface device is positioned on elastic elements (17) integral with said high density grid (1, 1').

15. A machine according to claim 10, characterised in that the unused contact needles (16) of the machine grid (1, 1') are not pressed during the test stroke.

16. A machine according to claim 13, characterised in that said outer plate of the interface device, facing towards the fixture, is one of a plurality of interchangeable outer plates, each of which is of a different thickness, said interface device also being operable without said outer plate, so that the same compression of the contacts of the grid is always obtained depending upon how much the needles of the fixture protrude.

17. A machine according to claim 10, characterised in that said grid (1, 1') and/or said interface device (2, 2') comprise any combination of rigid and spring needles (16, 15).

18. A machine according to claim 10, characterised in that it comprises a lower test assembly (101) and an upper test assembly (101'), with respective interface devices (2, 2'), for carrying out simultaneous tests on both faces of one or more printed circuit boards (4).

* * * * *

UNITED STATES PATENT AND TRADEMARK OFFICE
CERTIFICATE OF CORRECTION

PATENT NO. : 5,767,692
DATED : June 16, 1998
INVENTOR(S) : Gianpaolo Antonello, et. al.

It is certified that error appears in the above-identified patent and that said Letters Patent is hereby corrected as shown below:

Title page, item [56], under References Cited, add --

5,450,017    09/12/95    Swart

Foreign Patents 0 222 036    05/20/87    European
0 651 260    05/03/95    European
0 184 619    06/18/86    European
0 142 119    05/22/85    European Other Documents
PROCESS CONTROL BEGINS WITH TESTING THE BARE BOARD, S. Leonard Spitz, Electronic Packaging & Production, Vol. 28, No. 12, December 1988, Pages 46-49, Signed and Sealed this Twelfth Day of January, 1999

Attest:

*Attesting Officer*    *Acting Commissioner of Patents and Trademarks*